United States Patent
Xu et al.

(10) Patent No.: US 10,522,644 B1
(45) Date of Patent: Dec. 31, 2019

(54) DIFFERENT UPPER AND LOWER SPACERS FOR CONTACT

(71) Applicant: GLOBALFOUNDRIES INC., Grand Cayman (KY)

(72) Inventors: Guowei Xu, Ballston Lake, NY (US); Hui Zang, Guilderland, NY (US); Haiting Wang, Clifton Park, NY (US); Scott Beasor, Greenwich, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/014,076

(22) Filed: Jun. 21, 2018

(51) Int. Cl.
| | |
|---|---|
| *H01L 27/088* | (2006.01) |
| *H01L 29/51* | (2006.01) |
| *H01L 29/78* | (2006.01) |
| *H01L 29/66* | (2006.01) |
| *H01L 21/768* | (2006.01) |

(52) U.S. Cl.
CPC ...... *H01L 29/513* (2013.01); *H01L 21/76897* (2013.01); *H01L 29/517* (2013.01); *H01L 29/518* (2013.01); *H01L 29/6656* (2013.01); *H01L 29/66795* (2013.01); *H01L 29/7851* (2013.01)

(58) Field of Classification Search
USPC ........ 257/401, 135–136, 242, 329, E27.091, 257/E27.095–E27.096, E29.118–E29.274, 257/E29.313, E29.318, E29.262; 438/136, 137, 156, 173, 192, 206, 212
See application file for complete search history.

(56) References Cited

U.S. PATENT DOCUMENTS

| | | |
|---|---|---|
| 6,104,063 A | 8/2000 | Fulford, Jr. et al. |
| 6,399,512 B1 | 6/2002 | Blosse et al. |
| 6,492,270 B1 | 12/2002 | Lou |
| 6,635,566 B1 | 10/2003 | Blosse et al. |
| 7,767,590 B2 | 8/2010 | Chen et al. |
| 8,129,764 B2 | 3/2012 | Akram |
| 8,436,404 B2 | 5/2013 | Bohr et al. |
| 2015/0255571 A1* | 9/2015 | Xu ............... H01L 29/6681 257/288 |
| 2015/0357440 A1* | 12/2015 | Cheng ........... H01L 29/66795 257/401 |
| 2018/0337256 A1* | 11/2018 | Anderson ...... H01L 29/66666 |

* cited by examiner

*Primary Examiner* — Niki H Nguyen
(74) *Attorney, Agent, or Firm* — Gibb & Riley, LLC

(57) ABSTRACT

Various processes form different structures including exemplary apparatuses that include (among other components) a first layer having channel regions, source/drain structures in the first layer on opposite sides of the channel regions, a gate insulator on the channel region, and a gate stack on the gate insulator. The gate stack can include a gate conductor, and a stack insulator or a gate contact on the gate conductor. The gate stack has lower sidewalls adjacent to the source/drain structures and upper sidewalls distal to the source/drain structures. Further, lower spacers are between the source/drain contacts and the lower sidewalls of the gate stack; and upper spacers between the source/drain contacts and the upper sidewalls of the gate stack. In some structures, the upper spacers can partially overlap the lower spacers.

19 Claims, 12 Drawing Sheets

DIFFERENT UPPER AND LOWER SPACERS FOR CONTACT

BACKGROUND

Field of the Invention

The present disclosure relates to transistors and related devices, and more specifically, to spacers that are along contacts.

Description of Related Art

Integrated circuit devices use transistors for many different functions, and these transistors can take many different forms, from planar transistors, to transistors that use a "fin" style structure. A fin of a fin-type transistor is a thin, long, six-sided shape (that is somewhat rectangular) that extends from, or has a bottom surface that is part of, a substrate; with sides that are longer than they are wide, a top and bottom that have somewhat similar lengths as the sides (but that have widths that are much narrower) and ends that are approximately as tall from the substrate as the width of the sides, but that are only approximately as wide as the top and/or bottom. Rounding and uneven shaping can occur (especially at the corners and top) in such fin structures, and often such structures have a rounded, tapered shape; however, such structures are highly distinguishable from planar devices (even though both types of devices are highly useful).

Interlayer dielectric (ILD) insulator layers are often formed over layers containing transistors, and electrical connections are made as vias through such ILD layers to the components of the transistors. However, during the formation of such electrical connections through the ILDs, insulators of the underlying transistor devices can be detrimentally affected, compromising the operations of such transistors.

SUMMARY

Exemplary methods herein pattern a layer (of in situ formed, or later doped, semiconductor material) into fins to form a "first" layer or structure, form source/drain structures on opposite sides of channel regions in the first layer, and form gate insulators on the channel regions. Also, these methods form gate conductors on the gate insulators, and form a stack insulator on the gate conductors, to form gate stacks.

Further, such methods form a first spacer on sidewalls of such gate stacks in recesses between the gate stacks. The gate stacks have lower sidewalls adjacent to the source/drain structures and upper sidewalls distal to the source/drain structures. Herein, methods remove the first spacer from the source/drain structures at the bottom of the recesses and then form a sacrificial material on the first spacers to fill the (now first spacer-lined) recesses with such sacrificial material. Next, these methods reduce the height of the first spacers and the sacrificial material in the recesses to leave the first spacers only on the lower sidewalls of the gate stacks (to form lower spacers) and to leave the upper sidewalls of the gate stacks exposed. Such allows these methods to form upper spacers on the upper sidewalls of the gate stacks. Also, such methods can reduce the height of the sacrificial material additionally, relative to the lower spacers, before forming the upper spacers, and such processing causes the upper spacers to overlap a portion of the lower spacers (at a location where the lower spacers meet the upper spacers).

The sacrificial material is then removed to expose the source drain structures at the bottoms of the recesses. This permits formation of a source/drain contact (conductor material) on the lower spacers, the upper spacers, and the source/drain structures to fill the (now first and second spacer-lined) recesses with the source/drain contacts. If the height of the sacrificial material is reduced additionally relative to the lower spacers, as indicated optionally above, this will cause the upper spacers to extend into the source/drain contacts where the upper spacers meet the lower spacers.

Further, such methods form a dielectric layer on the source/drain contacts, pattern the dielectric layer to form openings to the source/drain contacts using etching processes, and form conductors in the openings. This etching process can damage the material used for lower spacers more than the material used for the upper spacers. However, the lower spacers are protected by the more etch resistant upper spacers during the etching, so using a more etch-resistant material for the upper spacers positioned along the upper sidewalls of the recesses prevents significant etch damage while still allowing a less etch-resistant, but higher electrical performance material to be used for the lower spacers along the lower sidewalls of the gate stacks.

These various processes form different structures including an exemplary apparatus that includes (among other components) a first layer or structure having a channel region, source/drain structures in the first layer on opposite sides of the channel region, a gate insulator on the channel region, and a gate stack on the gate insulator. For example, the first layer can be a fin of semiconductor material.

The gate stack can include a gate conductor and a stack insulator on the gate conductor. The gate stack has lower sidewalls adjacent to the source/drain structures and upper sidewalls distal to the source/drain structures. Further, lower spacers are between the source/drain contacts and the lower sidewalls of the gate stack; and upper spacers are between the source/drain contacts and the upper sidewalls of the gate stack.

In some structures, the upper spacers can partially overlap the lower spacers, and in such structures, the upper spacers extend into the source/drain contacts where the upper spacers meet the lower spacers. Additionally, the upper spacers are formed of a material that is damaged less by etching processes relative to the lower spacers. For example, the upper spacers can be a metal oxide or nitride material (e.g., aluminum oxide, a hafnium oxide, a silicon nitride, etc.) and the lower spacers can be a low-k insulator material (e.g., a silicon oxide). Also, the lower sidewalls and the upper sidewalls can be approximately the same length.

BRIEF DESCRIPTION OF THE DRAWINGS

The embodiments herein will be better understood from the following detailed description with reference to the drawings, which are not necessarily drawn to scale and in which.

DETAILED DESCRIPTION

Figure 1A:
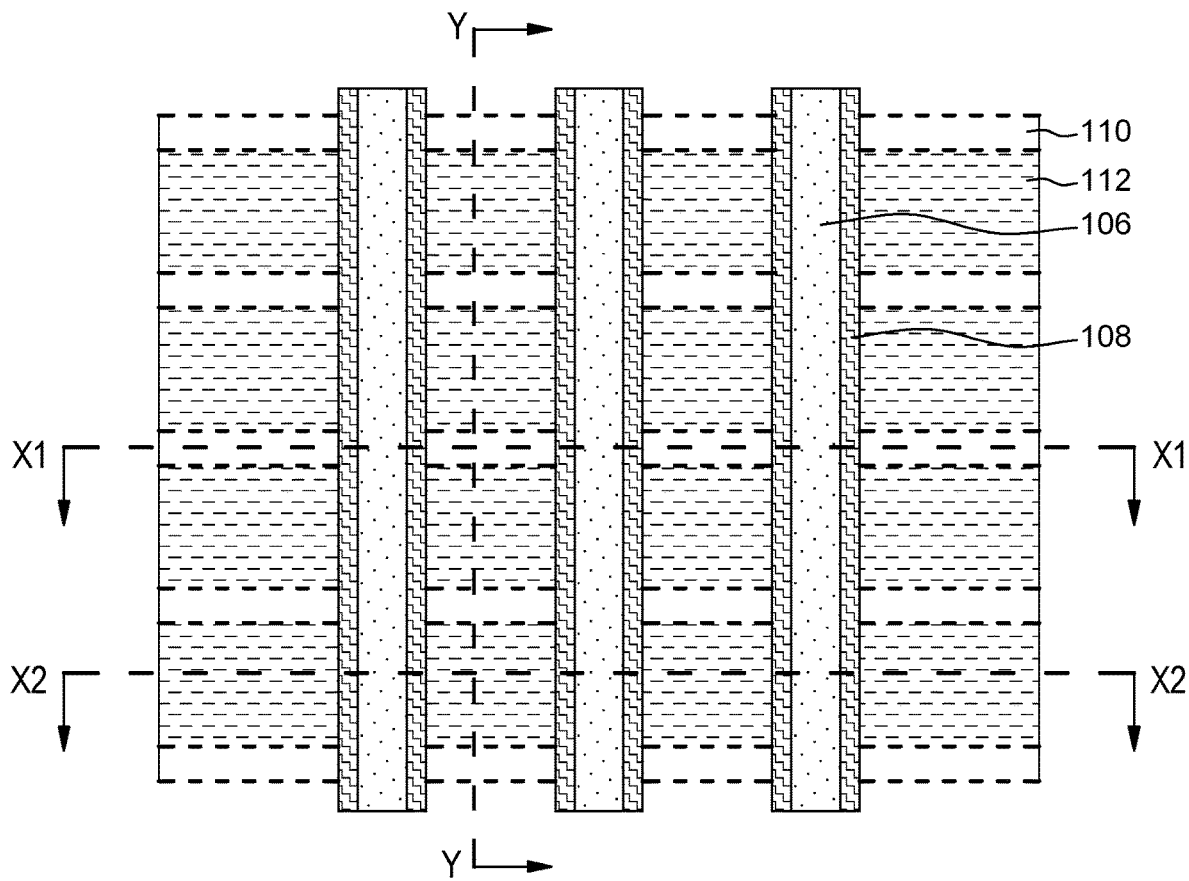
FIG. 1A is a top (plan) view conceptual schematic diagram of an integrated circuit structure according to embodiments herein.

As mentioned above, during the formation of electrical connections through interlayer dielectrics (ILDs), insulators of the underlying transistor devices can be detrimentally affected, compromising the operations of such transistors. For example, an insulating spacer often separates gate conductors from laterally adjacent to contacts for source/drain structures. However, when via openings are formed through ILDs, this spacer can be damaged, potentially leading to an undesirable electrical connection begin formed between the gate conductor and the source/drain contacts (short circuit).

In an effort to avoid such circuits, the via opening etching process can be limited to prevent etching the spacer; however, if such processing is over-limited, this can result in incomplete formation of the via opening, which in turn can prevent the conductor that is subsequently formed within the via opening from making a proper electrical connection to the source/drain contacts (open circuit). Other solutions to such short circuits include the utilization of more etch resistant materials for such spacers; however, when such more etch resistant materials are placed adjacent to device elements (e.g., laterally adjacent to gate conductors, source/drain structures, etc.) they increase the effective capacitance (Ceff) experienced by such device elements, slowing the performance of the transistor. Thus, the device designer is tasked with the unenviable choice between increasing the likelihood of open circuits and/or decreasing device performance, or increasing the likelihood of open circuits when continuous single material spacers are used along the full length of the source/drain contacts.

In view of such issues, the present inventors have discovered that a high-performance, low-capacitance lower spacer can be formed between the gate conductors and the source/drain contacts, in combination with a more etch resistant upper spacer between the overriding gate stack insulators and the source/drain contacts in order to maintain high device performance, while avoiding the aforementioned short and open circuits.

There are various types of transistors, which have slight differences in how they are used in a circuit. For example, a bipolar transistor has terminals labeled base, collector, and emitter. A small current at the base terminal (that is, flowing between the base and the emitter) can control, or switch, a much larger current between the collector and emitter terminals. Another example is a field-effect transistor, which has terminals labeled gate, source, and drain. A voltage at the gate can control a current between source and drain. Within such transistors, a semiconductor (channel region) is positioned between the conductive source region and the similarly conductive drain (or conductive source/emitter regions), and when the semiconductor is in a conductive state, the semiconductor allows electrical current to flow between the source and drain, or collector and emitter. The gate is a conductive element that is electrically separated from the semiconductor by a "gate oxide" (which is an insulator); and current/voltage within the gate changes makes the channel region conductive, allowing electrical current to flow between the source and drain. Similarly, current flowing between the base and the emitter makes the semiconductor conductive, allowing current to flow between the collector and emitter.

A positive-type transistor "P-type transistor" uses impurities such as boron, aluminum or gallium, etc., within an intrinsic semiconductor substrate (to create deficiencies of valence electrons) as a semiconductor region. Similarly, an "N-type transistor" is a negative-type transistor that uses impurities such as antimony, arsenic or phosphorous, etc., within an intrinsic semiconductor substrate (to create excessive valence electrons) as a semiconductor region.

Generally, transistor structures are formed by depositing or implanting impurities into a substrate to form at least one semiconductor channel region, bordered by shallow trench isolation regions below the top (upper) surface of the substrate. A "substrate" herein can be any material appropriate for the given purpose (whether now known or developed in the future) and can be, for example, silicon-based wafers (bulk materials), ceramic materials, organic materials, oxide materials, nitride materials, etc., whether doped or undoped. Isolation structures are generally formed using highly insulating material (this allows different active areas of the substrate to be electrically isolated from one another). Also, a hardmask can be formed of any suitable material, whether now known or developed in the future, such as a nitride, metal, or organic hardmask, that has a hardness greater than the substrate and insulator materials used in the remainder of the structure.

When patterning any material herein, the material to be patterned can be grown or deposited in any known manner and a patterning layer (such as an organic photoresist) can be formed over the material. The patterning layer (resist) can be exposed to some pattern of light radiation (e.g., patterned exposure, laser exposure, etc.) provided in a light exposure pattern, and then the resist is developed using a chemical agent. This process changes the physical characteristics of the portion of the resist that was exposed to the light. Then one portion of the resist can be rinsed off, leaving the other portion of the resist to protect the material to be patterned (which portion of the resist that is rinsed off depends upon whether the resist is a negative resist (illuminated portions remain) or positive resist (illuminated portions are rinsed off). A material removal process is then performed (e.g., wet etching, anisotropic etching (orientation dependent etching), plasma etching (reactive ion etching (RIE), etc.)) to remove the unprotected portions of the material below the resist to be patterned. The resist is subsequently removed to leave the underlying material patterned according to the light exposure pattern (or a negative image thereof).

For purposes herein, "sidewall spacers" are structures are generally formed by depositing or growing a conformal insulating layer (such as any of the insulators mentioned above) and then performing a directional etching process (anisotropic) that etches material from horizontal surfaces at a greater rate than its removes material from vertical surfaces, thereby leaving insulating material along the vertical sidewalls of structures. This material left on the vertical sidewalls is referred to as sidewall spacers.

FIGS. 1A-17 use an example that shows field effect transistors (FETs), and more specifically complementary metal oxide semiconductor (CMOS) fin-type FETs (Fin-FETs) that share a common drain. While only one or a limited number of transistors are illustrated in the drawings, those ordinarily skilled in the art would understand that many different types transistor could be simultaneously formed with the embodiment herein and the drawings are intended to show simultaneous formation of multiple different types of transistors; however, the drawings have been simplified to only show a limited number of transistors for clarity and to allow the reader to more easily recognize the different features illustrated. This is not intended to limit this disclosure because, as would be understood by those ordinarily skilled in the art, this disclosure is applicable to structures that include many of each type of transistor shown in the drawings.

Figure 1B:
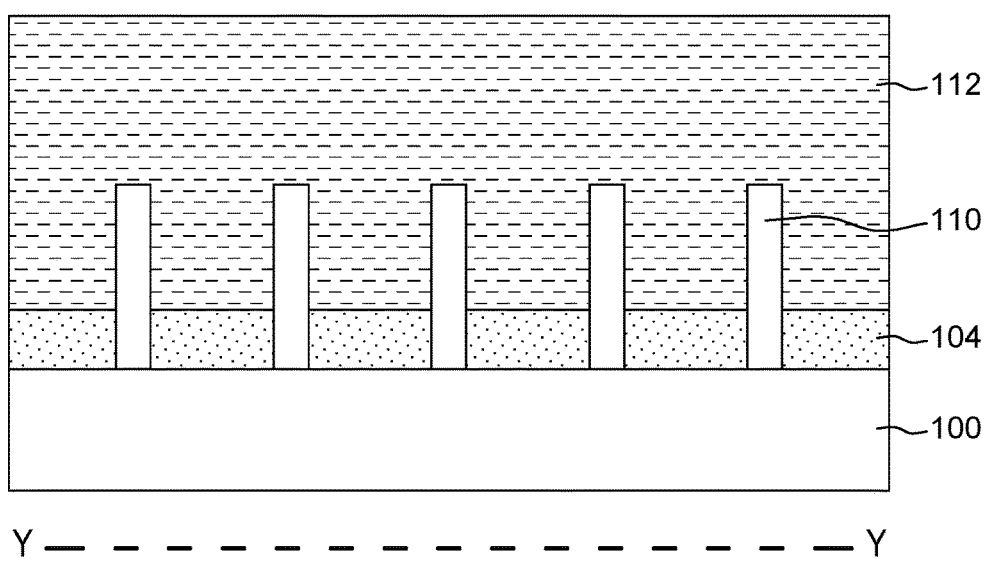
FIG. 1B is a cross-sectional view conceptual schematic diagram along line Y-Y in FIG. 1A of an integrated circuit structure according to embodiments herein.
Figure 1C:
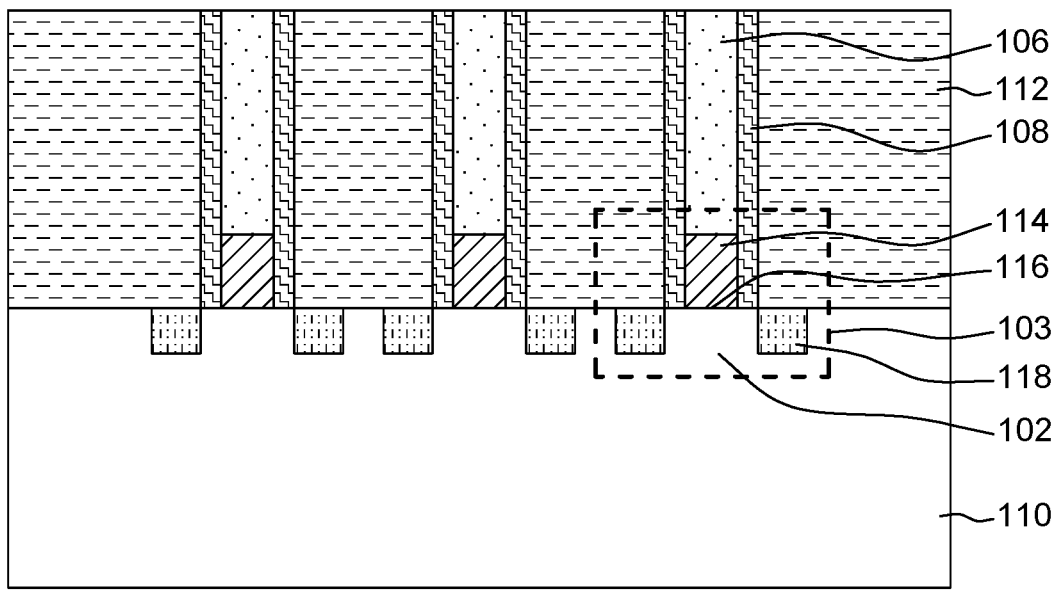
FIG. 1C is a cross-sectional view conceptual schematic diagram along line X1-X1 in FIG. 1A of an integrated circuit structure according to embodiments herein.
Figure 1D:
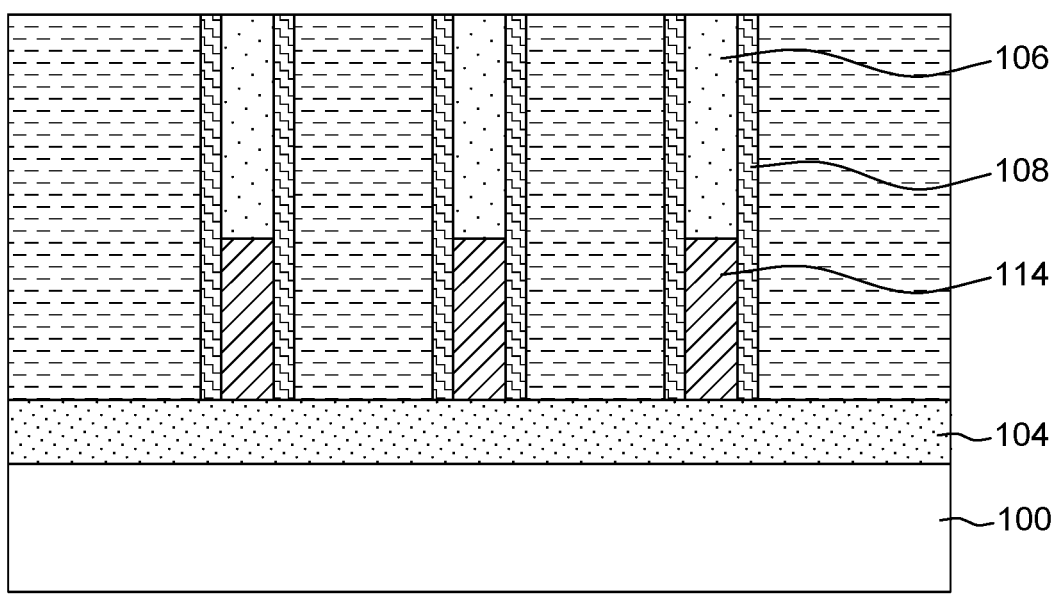
FIG. 1D is a cross-sectional view conceptual schematic diagram along line X2-X2 in FIG. 1A of an integrated circuit structure according to embodiments herein.

As noted above, one exemplary structure presented herein uses a high-performance, low-capacitance lower spacer between the gate conductors and the source/drain contacts, in combination with a more etch resistant upper spacer between the overriding gate stack insulators and the source/drain contacts. FIGS. 1A-1D illustrate one example of a partially formed fin-type structure. More specifically, FIG. 1A is a top (plan) view conceptual schematic diagram of an integrated circuit structure according to embodiments herein, FIG. 1B is a cross-sectional view conceptual schematic diagram of the same along line Y-Y in FIG. 1A, FIG. 1C is a cross-sectional view conceptual schematic diagram along line X1-X1 in FIG. 1A, and FIG. 1D is a cross-sectional view conceptual schematic diagram along line X2-X2 in FIG. 1A.

To form the structures shown in FIGS. 1A-1D, different processing can be used. In some exemplary methods, a layer 100 (of in situ formed, or later doped, semiconductor material) is patterned into fins 110 as shown in FIG. 1B. As shown in FIG. 1C, this forms a "first" layer or structure (e.g., fins 110). Note that while the first layer 110 can be a fin structure, it does not need to be, and the first layer 110 can, in some implementations, simply be a planar layer. Therefore, the fins 110 are sometimes generically referred to herein simply as a first layer 110. As can be seen in FIGS. 1B and 1C, an insulator or isolation material 104 can be formed and reduced in height to reveal the fins 110.

For purposes herein, a "semiconductor" is a material or structure that may include an implanted or in situ (e.g., epitaxially grown) impurity that allows the material to sometimes be a conductor and sometimes be an insulator, based on electron and hole carrier concentration. As used herein, "implantation processes" can take any appropriate form (whether now known or developed in the future) and can be, for example, ion implantation, etc. Epitaxial growth occurs in a heated (and sometimes pressurized) environment that is rich with a gas of the material that is to be grown.

A gate insulator 116 (e.g., gate oxide) is deposited or grown on (directly contacting) the first layer 110, and gate conductors 114 (e.g., a specific work function metal) are formed on (over, directly contacting) the gate insulators 116. Note that in some methods, the gate conductors 114 can be preceded by placeholding sacrificial structures (e.g., dummy gates). Additionally, insulators (such as silicon nitride) are formed on (over, directly contacting) the gate conductors 114, and such insulators are sometimes referred to herein as "stack" insulators 106, and this thereby forms gate stacks 114, 106. Sidewall spacers 108 (e.g., low-k insulators) are positioned along (laterally adjacent to, directly contacting) the gate stacks 114, 106. In some processing, such sidewall spacers 108 are formed on the dummy gates before formation of the gate stacks 114, 106.

The sidewall spacers 108 can be seen on opposite sides of the gate stacks 114, 106, in FIGS. 1A, 1C, and 1D. Further, FIG. 1A illustrates that the fins 110 are elongated (having a length longer than their width) approximately parallel structures, and similarly the gate stacks 114, 106 are elongated approximately parallel structures. Also, FIG. 1A illustrates that the fins 110 run in a direction (orientation) that is approximately perpendicular to the orientation of the gate stacks 114, 106.

For purposes herein, an "insulator" is a relative term that means a material or structure that allows substantially less (<95%) electrical current to flow than does a "conductor." The dielectrics (insulators) mentioned herein can, for example, be grown from either a dry oxygen ambient or steam and then patterned. Alternatively, the dielectrics herein may be formed (grown or deposited) from any of the many candidate high dielectric constant (high-k) materials, including but not limited to silicon oxides, silicon nitride, silicon oxynitride, metal oxides (e.g., tantalum oxide, etc.). The thickness of dielectrics herein may vary contingent upon the required device performance.

The conductors mentioned herein can be formed of any conductive material, such as polycrystalline silicon (poly-silicon), amorphous silicon, a combination of amorphous silicon and polysilicon, polysilicon-germanium, rendered conductive by the presence of a suitable dopant, etc. Alternatively, the conductors herein may be one or more metals, such as tungsten, hafnium, tantalum, molybdenum, titanium, or nickel, or a metal silicide, any alloys of such metals, and may be deposited using physical vapor deposition, chemical vapor deposition, or any other technique known in the art. Further, some conductors herein can be partially or fully formed of a metal having a specific work function. The work function of the conductor can be selected to use a specific amount of energy to remove an electron from the solid material, and thereby enhance transistor performance.

The portions of the first layer 110 adjacent to (beneath) the gate conductors 114 are designated as channel regions 102. Various implants are made into the first layer 110 in a self-aligned manner using the sidewall spacers 108 as alignment/patterning structures to form source/drain structures 120 on opposite sides of channel regions 102 in the first layer 110. Additional insulator layers 112 (e.g., oxides) can be formed to electrically protect such structures.

Figure 2:
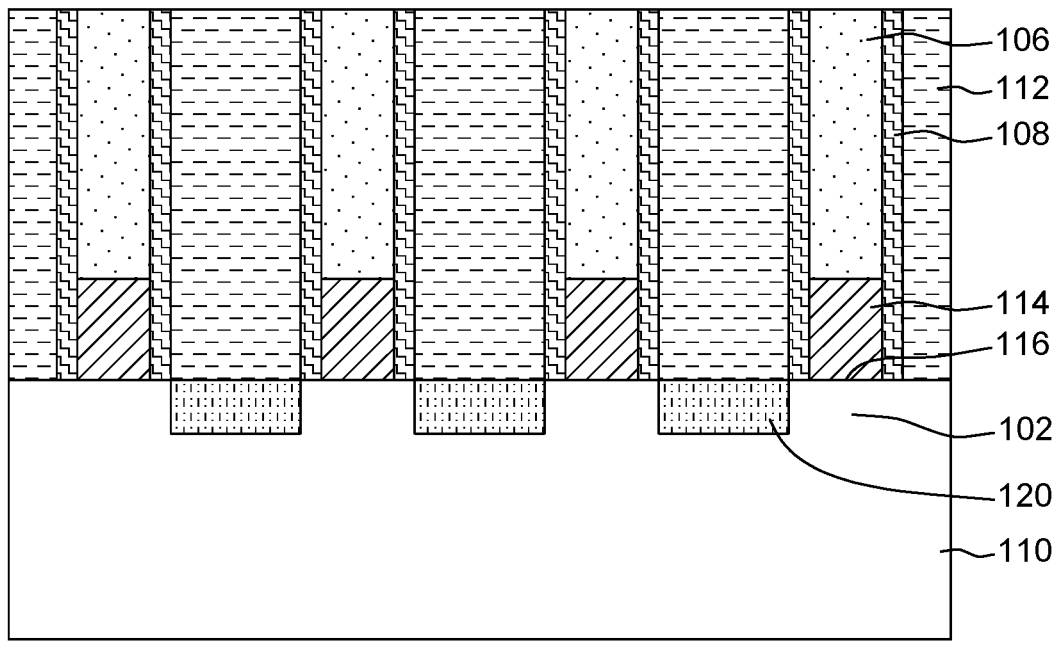
FIG. 2-16 are cross-sectional view conceptual schematic diagrams along line X1-X1 in FIG. 1A of different stages of formation of an integrated circuit structure according to embodiments herein.

FIG. 2-16 are cross-sectional view schematic diagrams along line X1-X1 in FIG. 1A conceptually illustrating different stages of formation of exemplary integrated circuit structure. As shown in FIG. 2, methods herein form common drains 120 between channel regions (such that the source/drain structures are continuous between the channel regions 102) that can be used, for example, in some CMOS structures (such as inverters).

Figure 3:
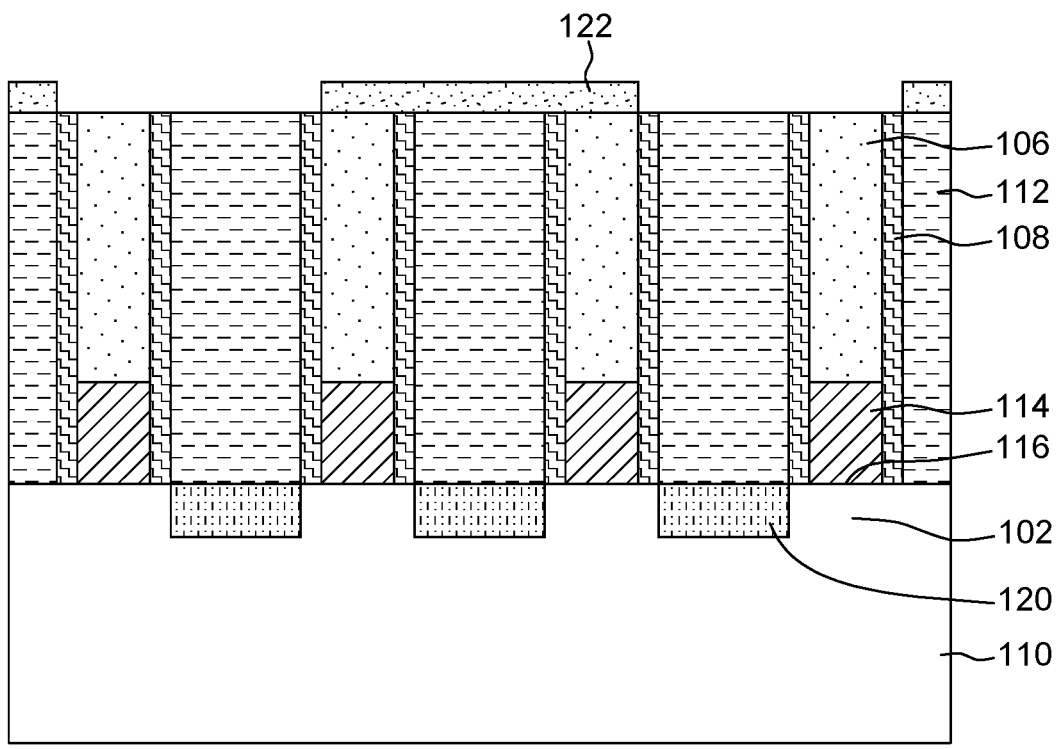
Figure 4:
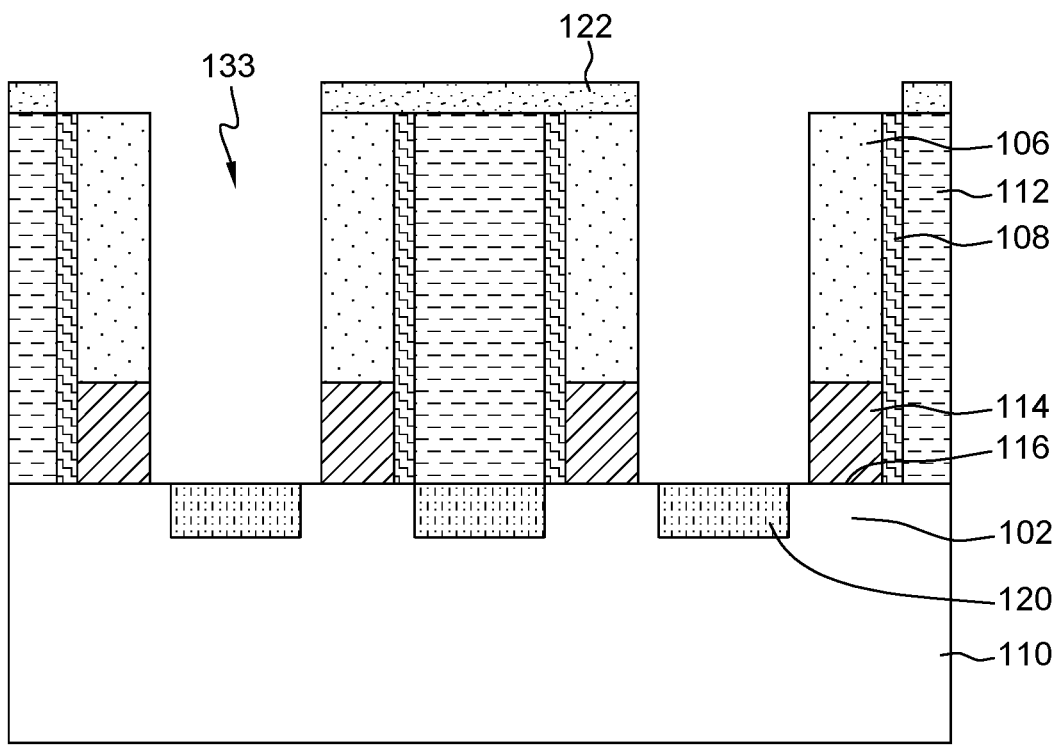
Figure 5:
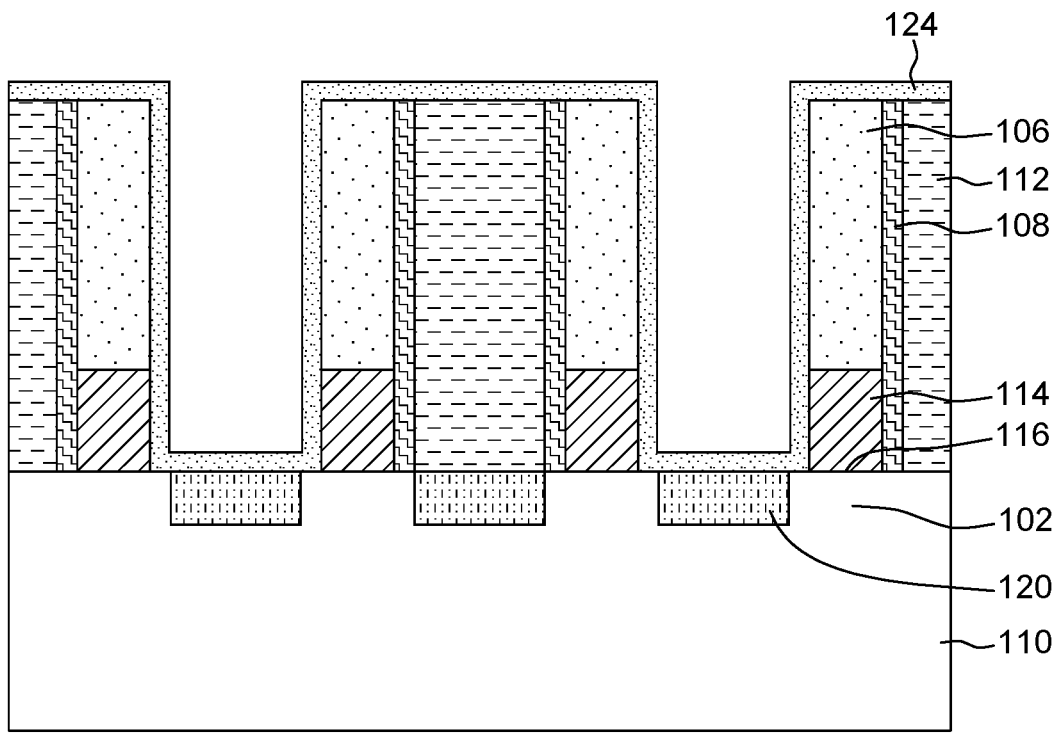
Figure 6:
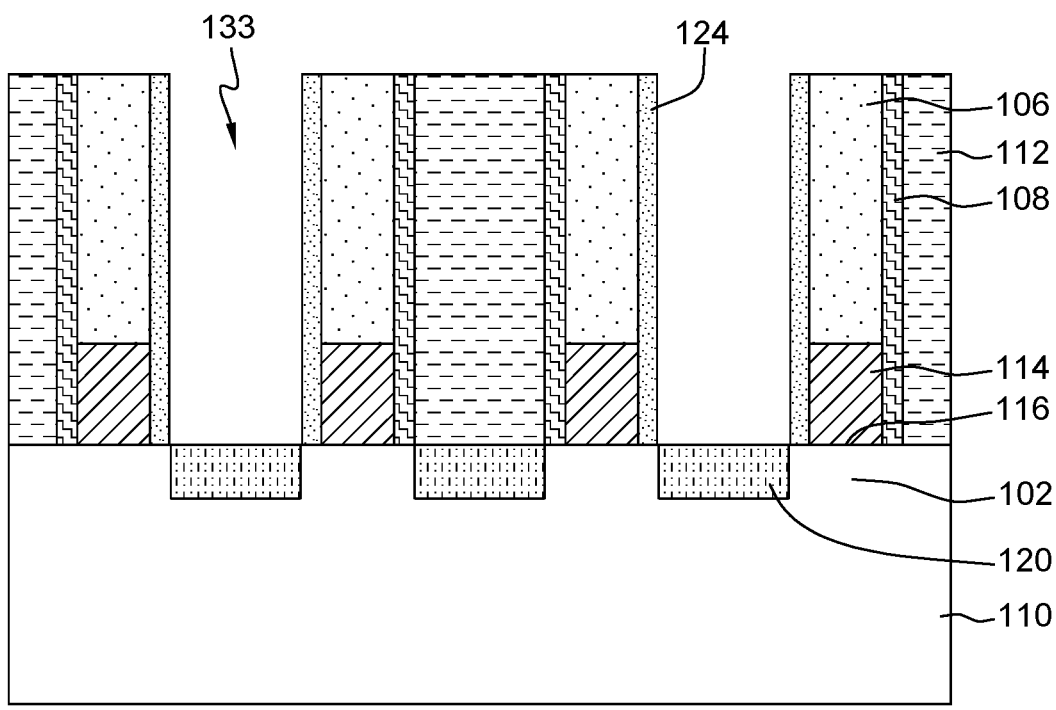

As shown in FIG. 3, a mask 122 is patterned over some of the stack insulators 106. In FIG. 4, a material removal process (etching, wet processing, etc.) is performed through the openings in the mask 122 to form openings or recesses 133 fully through the insulator 112 to expose some (but not all) of the source/drain structures 120. In FIG. 5, a first spacer material 124 (e.g., silicon dioxide, etc.) is grown or deposited to conformally line the recesses 133. In FIG. 6, a directional etching process (e.g., anisotropic) is used to leave the first spacer 124 only on the sidewalls of such gate stacks 114, 106 in recesses 133 between the gate stacks 114, 106, and this removes the first spacer 124 from the source/drain structures 120 at the bottom of the recesses 133.

Figure 7:
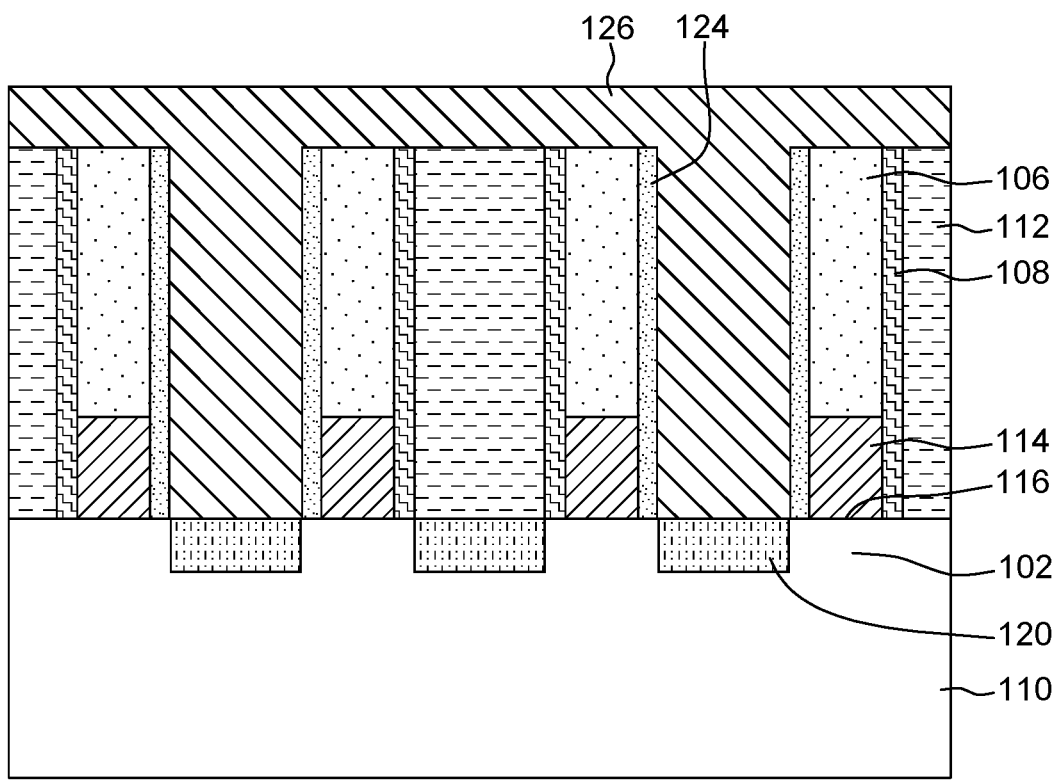
Figure 8:
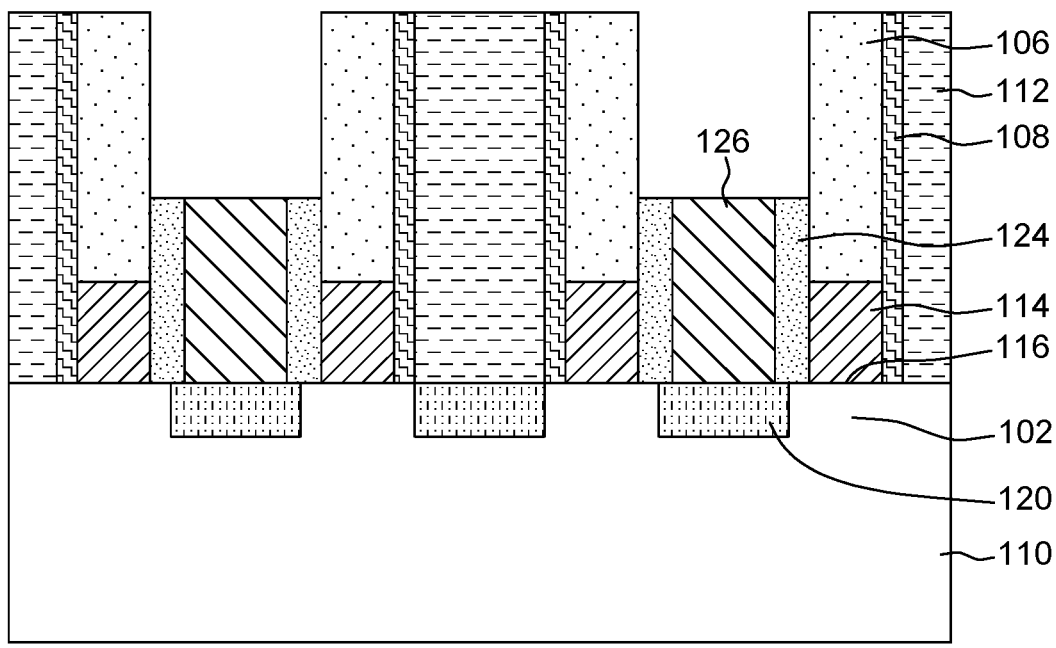
Figure 9:
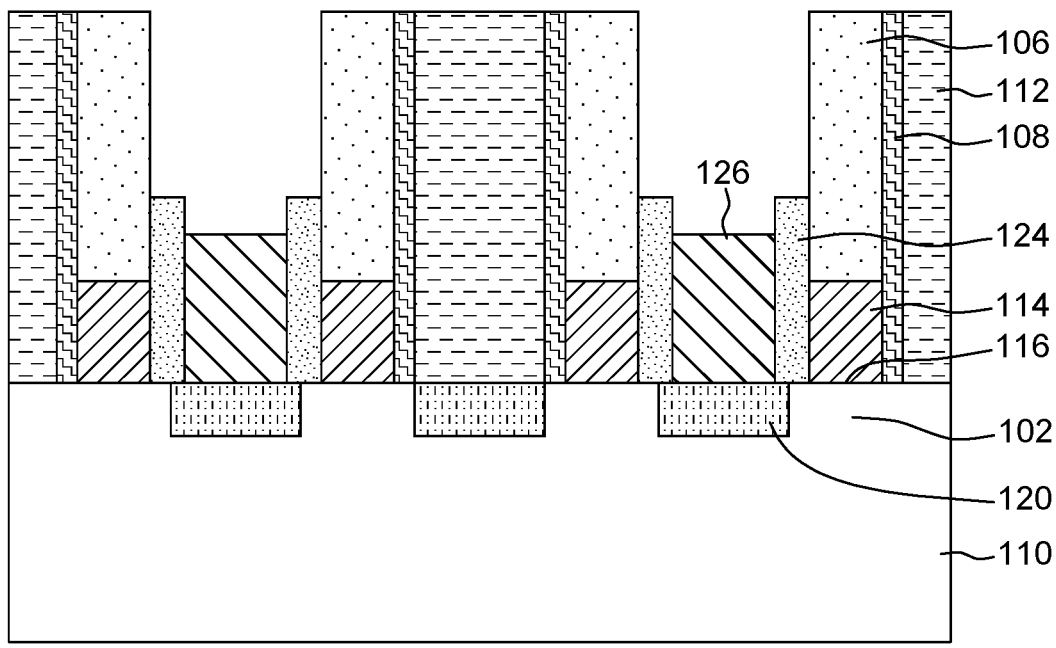

As shown in FIG. 7, such processing then forms (e.g., deposits) a sacrificial material 126 (e.g., such as an optical polymerization layer (OPL) or other suitable material) on the first spacers 124 to fill the (now first spacer 124-lined) recesses with such sacrificial material 126. Next, as shown in FIG. 8, these methods perform any suitable material removal process to reduce the height of the first spacers 124 and the sacrificial material 126 in the recesses 133 to leave the first spacers 124 only on the lower sidewalls of the gate stacks 114, 106 (to form lower spacers 124) and to leave the upper sidewalls of the gate stacks 114, 106 exposed. Also, as shown in FIG. 9, such methods can perform a material removal process that selectively attacks the sacrificial material 126 (without substantially affecting the first spacer 124 material) to reduce the height of the sacrificial material 126 additionally, relative to the first spacers 124.

This processing defines that the gate stacks 114, 106 have lower sidewall portions that are closer to (adjacent to) the source/drain structures 120 and upper sidewall portions that are further from (distal to) the source/drain structures 120. Because the first spacers 124 now only remain on the lower sidewalls of the gate stacks 114, they are sometimes referred to herein as lower spacers 124.

Figure 10:
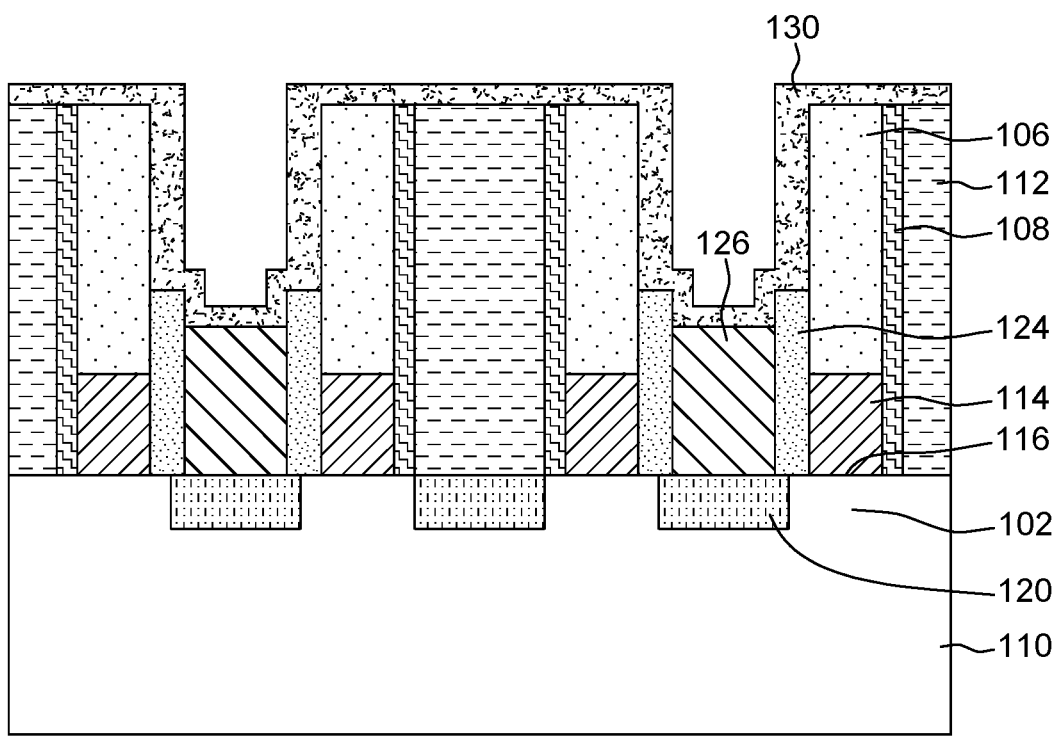

As shown in FIG. 10, these methods then form (deposit or grow) a conformal material 130 that is relatively more etch resistant than the lower spacers 124, such as hafnium oxide, aluminum oxide, silicon nitride, etc. By reducing the height of the sacrificial material 126 additionally, relative to the lower spacers 124, before forming the upper spacers 130, such processing causes the upper spacers 130 to overlap a portion of the lower spacers 124 (at a location where the lower spacers 124 meet the upper spacers 130).

Figure 11:
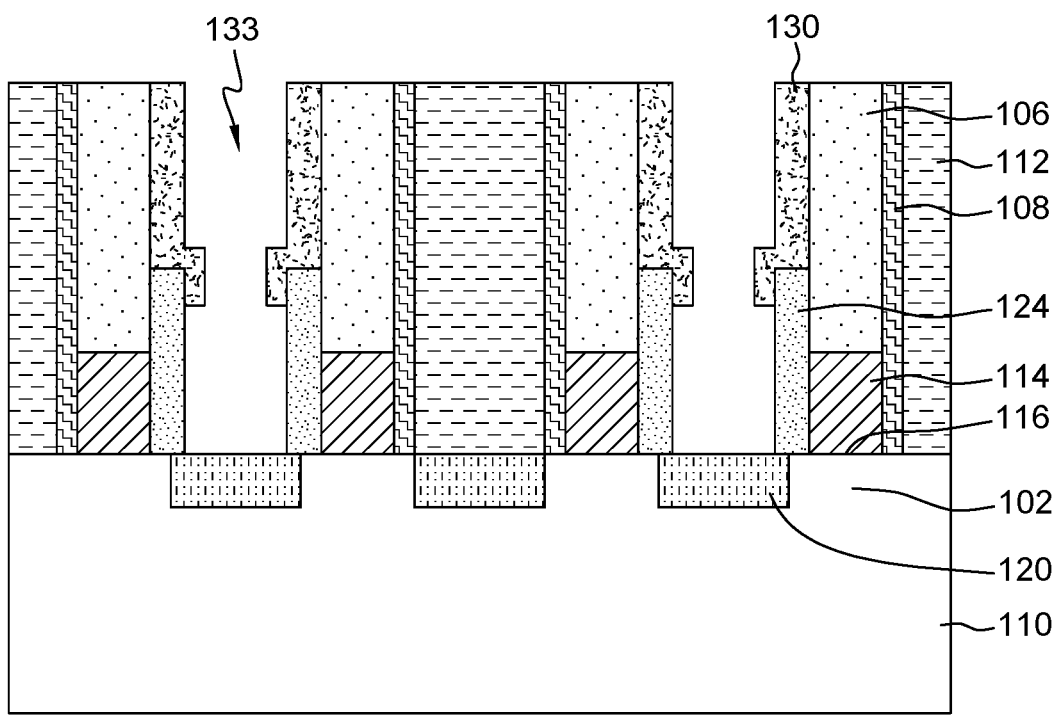

As shown in FIG. 11, a directional material removal process is used to leave the material 130 only on the upper sidewalls of the gate stacks 114, 106 to form what is referred to herein sometimes as upper spacers 130 on the upper sidewalls of the gate stacks 114, 106. The same (or a separate) material removal process is used to remove the sacrificial material 126 to expose the source drain structures 120 at the bottoms of the recesses 133.

Figure 12:
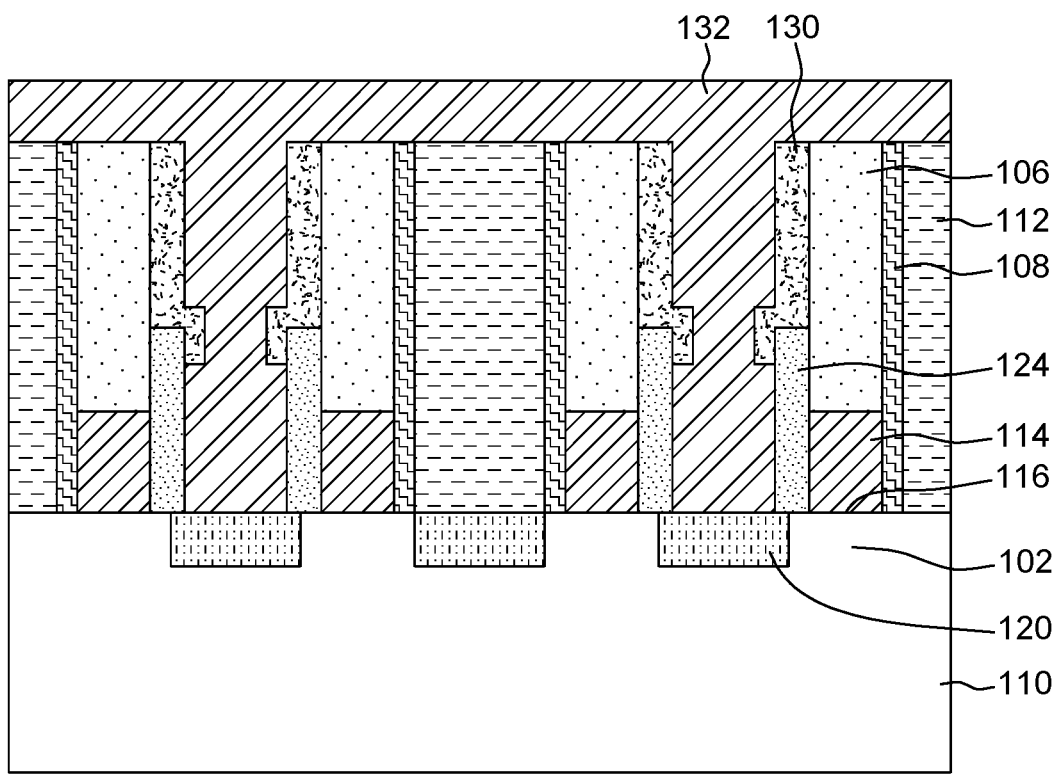
Figure 13:
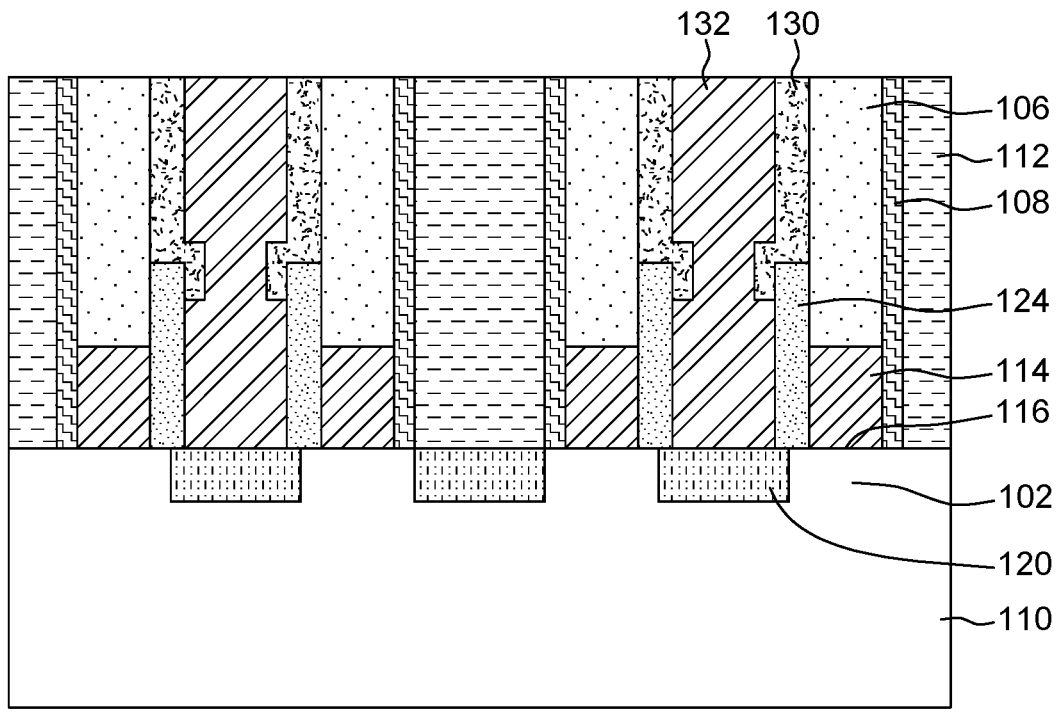

As shown in FIG. 12, a source/drain contact 132 (e.g., a titanium silicide, tungsten, etc.) is deposited on the lower spacers 124, the upper spacers 130, and the source/drain structures 120 to fill the (now first 124 and second 130 spacer-lined) recesses 133 with the source/drain contacts 132. FIG. 13 shows the structure after a planarization process (e.g., chemical mechanical polishing (CMP), etc.). If the height of the sacrificial material 126 is reduced additionally relative to the lower spacers 124, as indicated optionally above, this will cause the upper spacers 130 to extend into the source/drain contacts 132 where the upper spacers 130 meet the lower spacers 124. Because of this overlap, the source/drain contacts 132 have a straight upper sidewall and a co-linear straight lower sidewall that are separated by an indent into the source/drain contacts 132.

Figure 14:
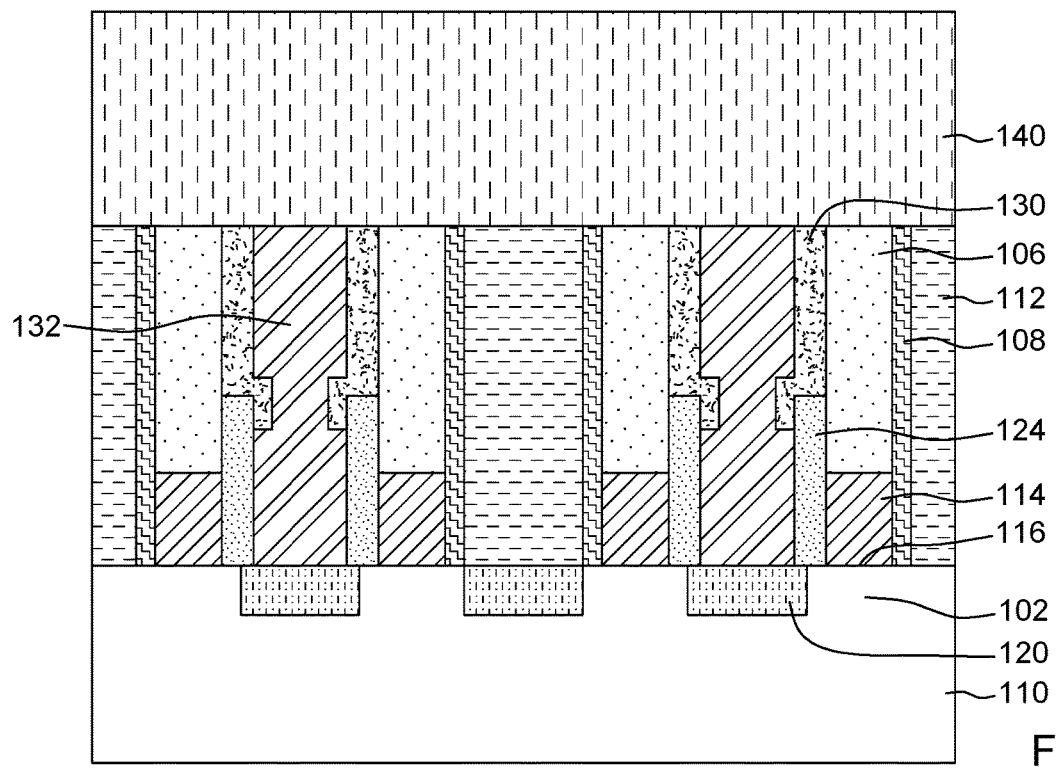
Figure 15A:
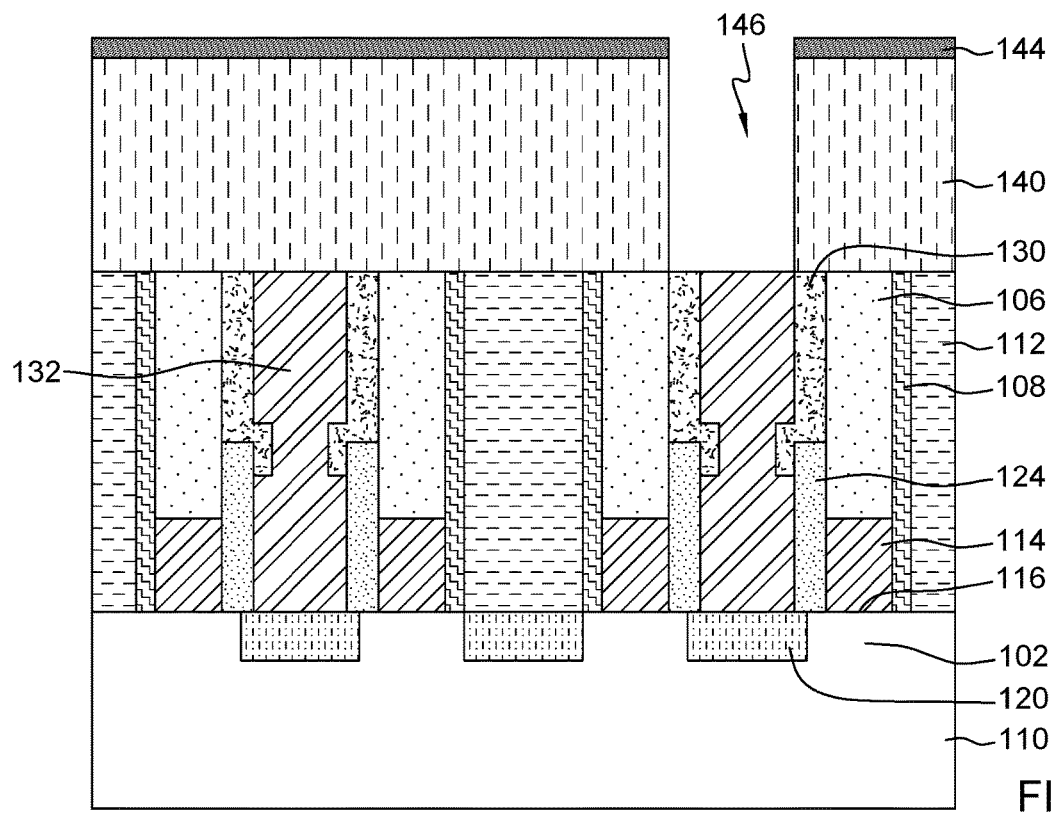

Further, as shown in FIG. 14, such methods form (deposit or grow) a dielectric layer 140 (e.g., ILD) on the source/drain contacts 132. As shown in FIG. 15A, this processing patterns the dielectric layer 140 using a patterned mask 144 to form openings 146 to the source/drain contacts 132 using etching processes. Note that the mask 144 and opening 146 are intentionally shown as being mis-aligned in FIG. 15A, as such is a common occurrence during manufacturing.

Figure 15B:
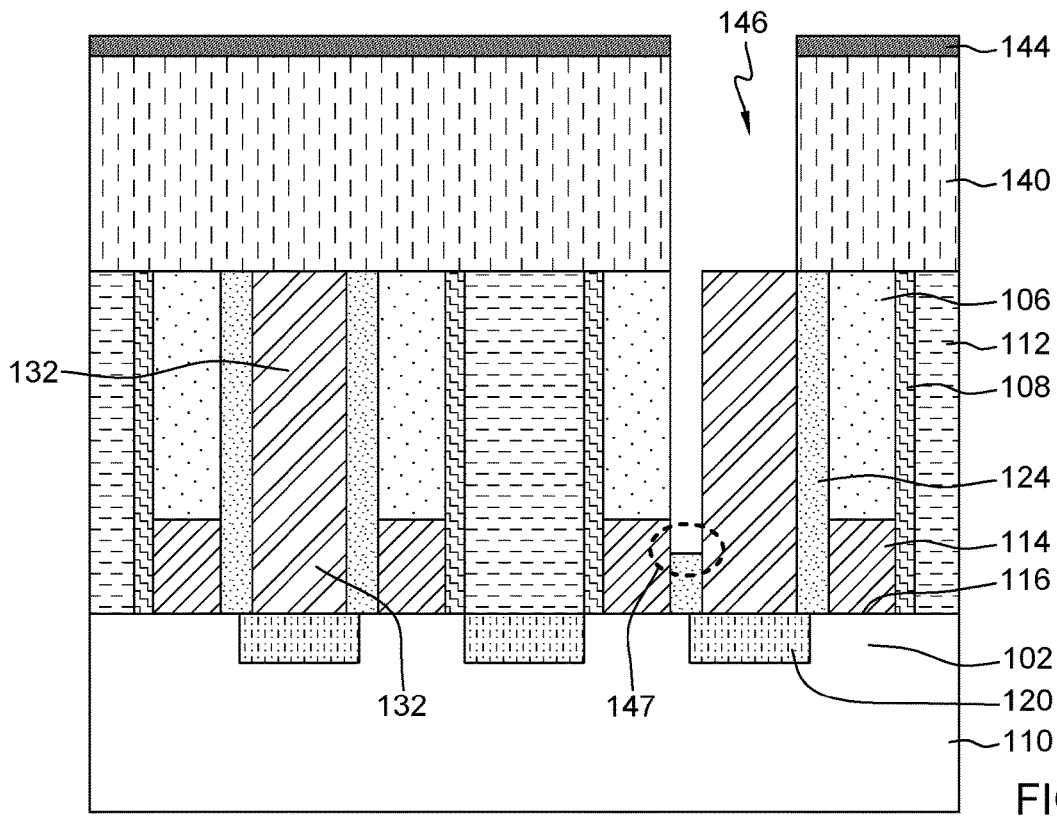

The etching process shown in FIG. 15A can damage the material used for lower spacers 124 more than the material used for the upper spacers 130. For example, as shown in FIG. 15B, if the upper spacers 130 are not in place (and there is the same mask 144 mis-alignment), portions of a first spacer 124 that runs the full length of the sidewall of the gate stack 114, 106 can be undesirably removed resulting in an area 147 where a short circuit can occur once the subsequent via conductor is formed. However, the lower spacers 124 are protected by the more etch resistant upper spacers 130 during the etching shown in FIG. 15A, so using a more etch-resistant material for the upper spacers 130 positioned along the upper sidewalls of the recesses prevents significant etch damage while still allowing a less etch-resistant, but higher electrical performance (lower Ceff) material to be used for the lower spacers 124 along the lower sidewalls of the gate stacks 114, 106.

Figure 16:
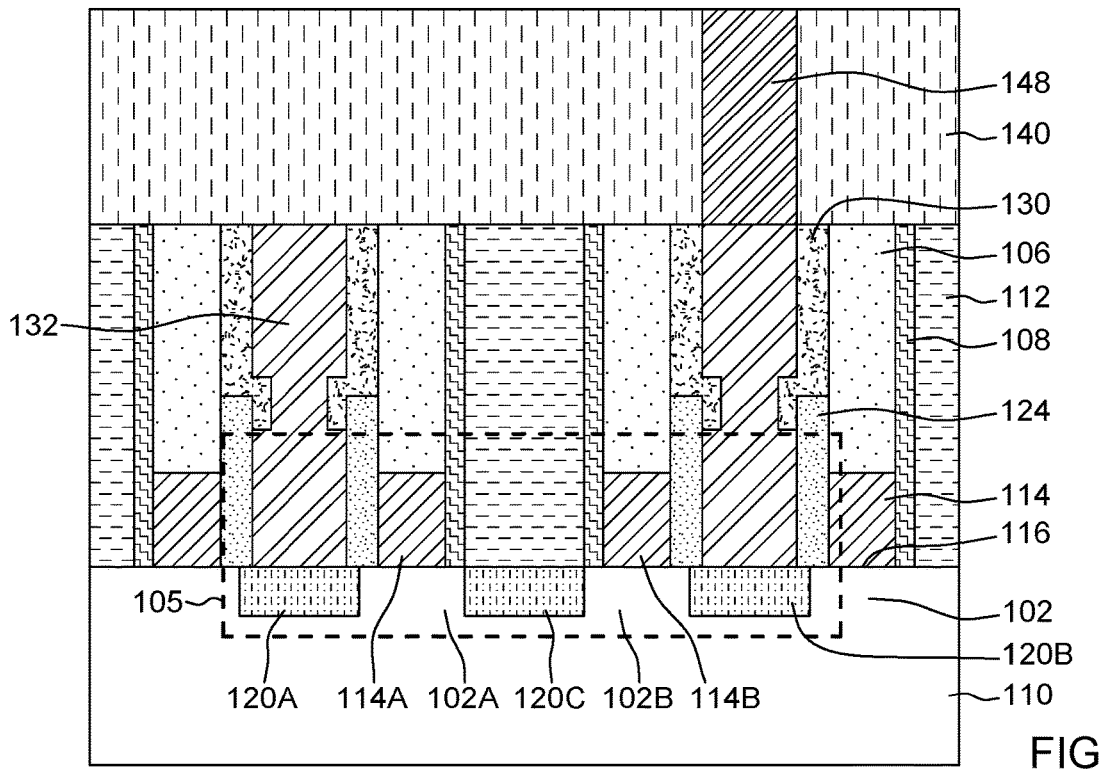

FIG. 16 illustrates that processing herein forms via conductors 148 in the via openings 146. If such via conductors 148 were formed in the structure shown in FIG. 15B, a short circuit between the gate conductor 114 and the source/drain contact 132 would be caused by the via conductor 148 filling the area 147 (by the via conductor 148 forming an electrical connection between the gate conductor 114 and the source/drain contact 132).

FIG. 16 also illustrates a CMOS structure 105 that includes a first transistor (source 120A, channel 102A, gate 114A, and shared drain 120C) and a second, opposite polarity, transistor (source 120B, channel 102B, gate 114B, and shared drain 120C). Such structures can be used to perform a number of logical operators, such as an inverter. Further, while the example in FIGS. 2-16 illustrate one specific transistor structure, those ordinarily skilled in the art would understand that the lower 124 and upper 130 spacers between the gate stack 114, 106 and the source/drain contact 132 could be used in any transistor structure that has an insulator between conductors that are to be electrically separated, and especially in all structures where lower capacitance in the lower spacer 124 is desired with higher etch resistance in the upper spacer 130.

Figure 17:
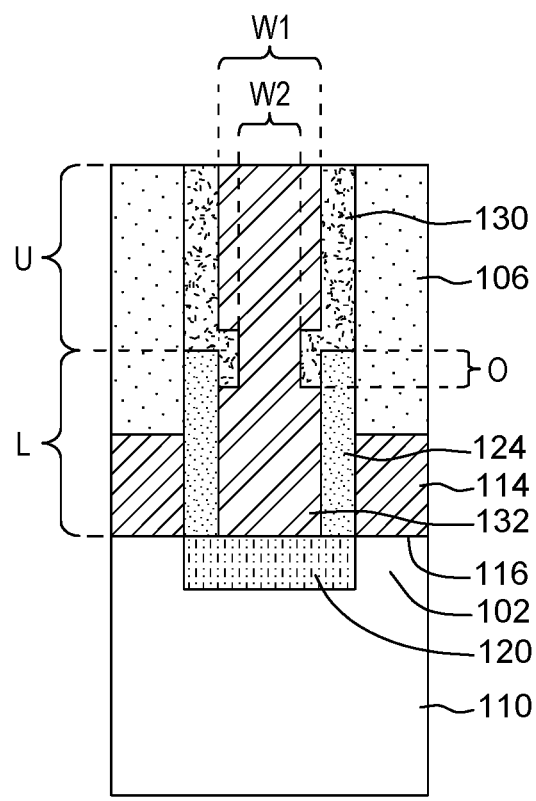
FIGS. 17 and 18 are enlarged portions of a cross-sectional view conceptual schematic diagram along line X1-X1 in FIG. 1A of an integrated circuit structure according to embodiments herein.
Figure 18:
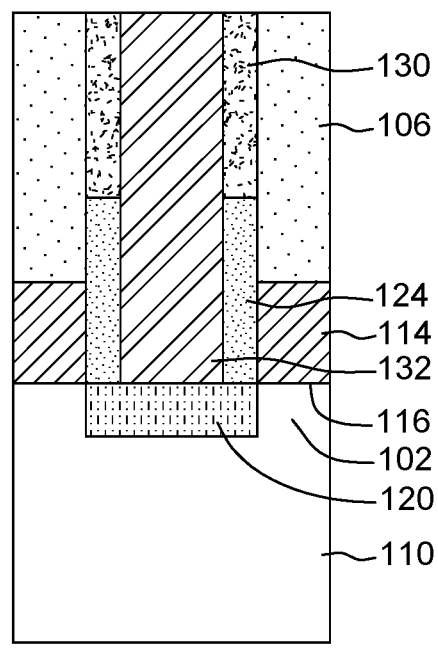

FIGS. 17 and 18 a magnified partial view of the structures centered on one of the source/drain structures 120. FIG. 17 shows that the lower portion L of the sidewalls (of the gate stack 114, 106, or the source/drain contact 132) is closer to the source/drain structure 120 than the upper portion U of the sidewalls (of the gate stack 114, 106, or the source/drain contact 132). Also, the lower portion L can be approximately the same length as the upper portion U (e.g. 50/50) or can be different lengths (e.g., 60/40, 70/30, 80/20, etc.).

In some structures herein, the lower portion L of the sidewall spacers is at least as long as the height of the top of gate conductor 114 (at least as long as how far the gate conductor 114 extends from the first layer 110). In other words, the lower spacer 124 is at least as tall as the gate conductor 114 (from the first layer 110), so as to prevent the upper spacer 130 from contacting the gate conductor 114. It can be desirable to prevent the upper spacer 130 from contacting the gate conductor 114, so as to avoid increased effective capacitance of the transistor.

FIG. 17 also illustrates that the overlap of the upper spacer 130 on the lower spacer 124 causes the upper spacer 130 to extend into the source/drain contact 132. The extension of the upper spacer 130 into the source/drain contact 132 decreases the width of the source/drain contact from W1 to W2 along the area where the upper spacer 130 overlaps the lower spacer 124. Also, the length of the extension of the upper spacer 130 into the source/drain contact 132 is greater than the length of the overlap O of the upper spacer 130 on the lower spacer 124 because of the corner formed in the upper spacer 130 as it covers the top of the lower spacer 124. The amount by which the extension of the upper spacer 130 into the source/drain contact 132 is greater than the length of the overlap O depends upon the thickness of the upper spacer 130 (e.g., depends upon the thickness of the corner over the top of the lower spacer 124).

As noted previously, the upper spacer 130 may overlap the lower spacer 124, but the upper spacer 130 may also not overlap the lower spacer 124 if the processing shown in FIG. 9 is skipped. FIG. 18 shows the structure without the upper spacer 130 overlapping the lower spacer 124. When there is no overlap of the upper spacer 130 on the lower spacer 124, the upper spacer 130 does not extend into the source/drain contact 132.

Referring again to FIG. 16, these various processes form different structures including an exemplary apparatus 105 that includes (among other components) a first layer 110 or structure having a channel region 102, source/drain structures 120 in the first layer 110 on opposite sides of the channel region 102, a gate insulator 116 on the channel region 106, and a gate stack 114, 106 on the gate insulator 116. For example, the first layer 110 can be a fin of semiconductor material.

The gate stack 114, 106 can include a gate conductor 114 and a stack insulator 106 on the gate conductor 114. The gate stack 114, 106 has lower sidewalls L adjacent to the source/drain structures 120 and upper sidewalls U distal to the source/drain structures 120. Further, lower spacers 124 are between the source/drain contacts 132 and the lower sidewalls L of the gate stack 114, 106; and upper spacers 130 are between the source/drain contacts 132 and the upper sidewalls U of the gate stack 114, 106.

In some structures, the upper spacers 130 can partially overlap the lower spacers 124, and in such structures, the upper spacers 130 extend into the source/drain contacts 132 where the upper spacers 130 meet the lower spacers 124. Additionally, the upper spacers 130 are formed of a material that is damaged less by etching processes relative to the lower spacers 124. For example, the upper spacers 130 can be a metal oxide or nitride material (e.g., aluminum oxide, a hafnium oxide, a silicon nitride, etc.) and the lower spacers 124 can be a low-k insulator material (e.g., a silicon oxide). Also, the lower sidewalls L and the upper sidewalls U can be approximately the same length.

Figure 19:
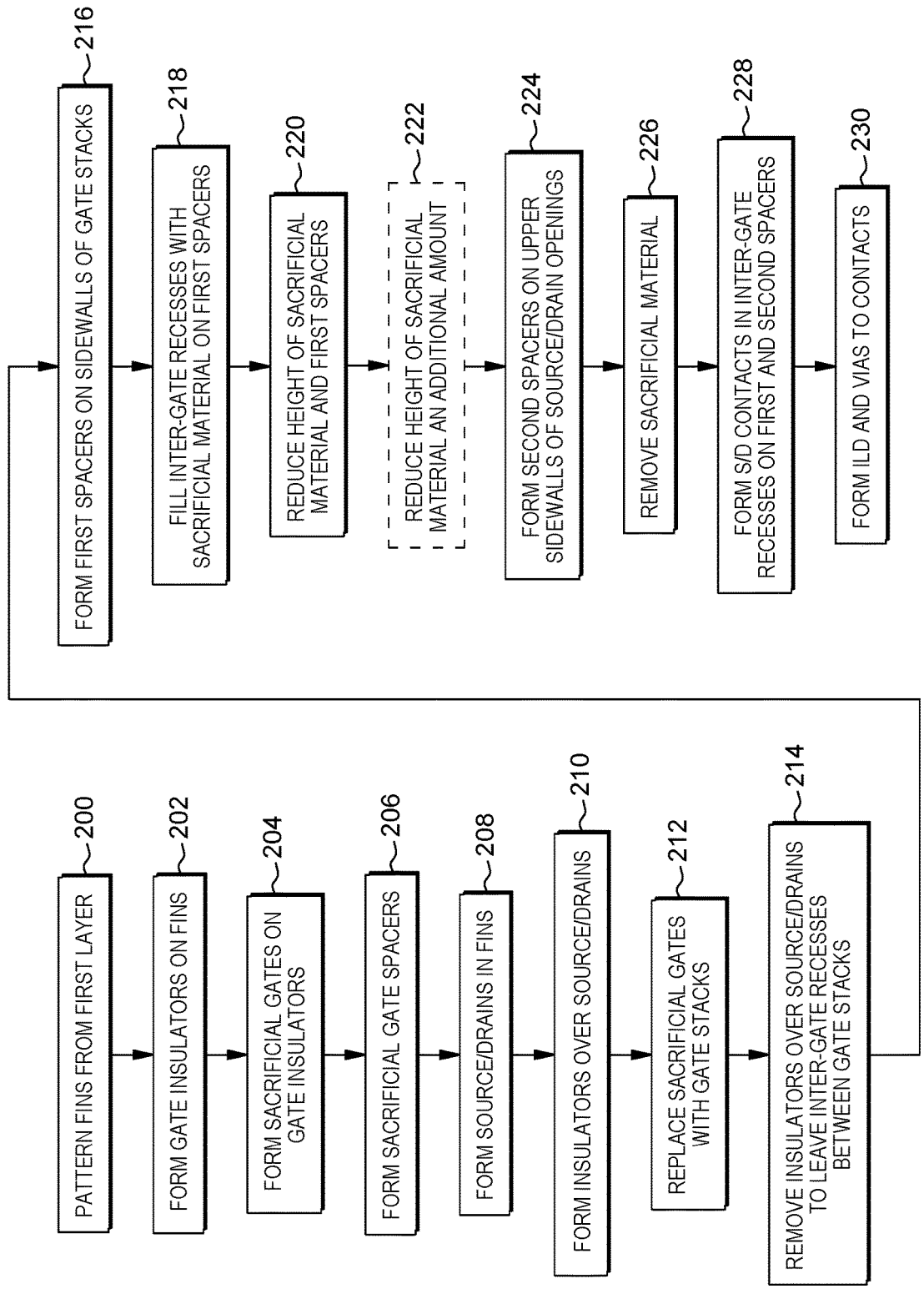
FIG. 19 is a flow diagram illustrating embodiments herein.

FIG. 19 is a flowchart illustrating the processing described above. As shown in item 200, methods herein pattern a layer (of in situ formed, or later doped, semiconductor material) into fins to form a "first" layer or structure. In item 202, these methods form gate insulators on the channel regions of the first layer. As noted previously, in item 204, sacrificial gates can be formed on the gate insulators. Following this, sacrificial gate spacers are formed on the sacrificial gates in item 206.

Next, in item 208, these methods form source/drain structures on opposite sides of channel regions in the first layer, using the sacrificial gate and spacers as self-alignment features. In item 210 insulators are formed over the source/drain structures. Next, in item 212 the sacrificial gates are removed and replaced with gate conductors that are formed on the gate insulators, and stack insulators are formed on the gate conductors, to form gate stacks. In item 214, the insulators over the source/drain structures are removed to leave inter-gate recesses between the gate stacks.

Further, as shown in item 216, such methods form a first spacer on sidewalls of such gate stacks in the recesses between the gate stacks. The gate stacks have lower sidewalls adjacent to the source/drain structures and upper sidewalls distal to the source/drain structures. In item 216, these methods also remove the first spacer from the source/drain structures at the bottom of the recesses.

In item 218, a sacrificial material is formed on the first spacers to fill the (now first spacer-lined) recesses with such sacrificial material. Then, in item 220, these methods reduce the height of the first spacers and the sacrificial material in the recesses to leave the first spacers only on the lower sidewalls of the gate stacks (to form lower spacers) and to leave the upper sidewalls of the gate stacks exposed. Also, as an optional step (shown by a dashed-line box) in item 222 such methods can reduce the height of the sacrificial material additionally, relative to the lower spacers, before forming the upper spacers, and such processing causes the upper spacers to overlap a portion of the lower spacers (at a location where the lower spacers meet the upper spacers). Either after 220 or 222, these methods then form upper spacers on the upper sidewalls of the gate stacks in item 224.

The sacrificial material is then removed in item 226 to expose the source drain structures at the bottoms of the recesses. This permits formation of a source/drain contact (conductor material) on the lower spacers, the upper spacers, and the source/drain structures to fill the (now first and second spacer-lined) recesses with the source/drain contacts, in item 228. If the height of the sacrificial material is reduced additionally relative to the lower spacers in item 222, as indicated optionally above, this will cause the upper spacers to extend into the source/drain contacts where the upper spacers meet the lower spacers.

Further, in item 230, such methods form a dielectric layer on the source/drain contacts, pattern the dielectric layer to form openings to the source/drain contacts using etching processes, and form conductors in the openings. This etching process in item 230 can damage the material used for lower spacers more than the material used for the upper spacers. However, the lower spacers are protected by the more etch resistant upper spacers during the etching, so using a more etch-resistant material for the upper spacers positioned along the upper sidewalls of the recesses prevents significant etch damage while still allowing a less etch-resistant, but higher electrical performance material to be used for the lower spacers along the lower sidewalls of the gate stacks.

The flowchart and block diagrams in the figures illustrate the architecture, functionality, and operation of possible implementations of devices and methods according to various embodiments. In this regard, each block in the flowchart or block diagrams may represent a module, segment, or portion of instructions, which includes one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the foregoing. As used herein, the singular forms "a," "an," and "the" are intended to include the plural forms as well, unless the context clearly indicates otherwise.

Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element.

Embodiments herein may be used in a variety of electronic applications, including but not limited to advanced sensors, memory/data storage, semiconductors, microprocessors and other applications. A resulting device and structure, such as an integrated circuit (IC) chip can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The corresponding structures, materials, acts, and equivalents of all means or step plus function elements in the claims below are intended to include any structure, material, or act for performing the function in combination with other claimed elements as specifically claimed. The description of the present embodiments has been presented for purposes of illustration and description, but is not intended to be exhaustive or limited to the embodiments in the form disclosed. Many modifications and variations will be apparent to those of ordinary skill in the art without departing from the scope and spirit of the embodiments herein. The embodiments were chosen and described in order to best explain the principles of such, and the practical application, and to enable others of ordinary skill in the art to understand the various embodiments with various modifications as are suited to the particular use contemplated.

While the foregoing has been described in detail in connection with only a limited number of embodiments, it should be readily understood that the embodiments herein are not limited to such disclosure. Rather, the elements herein can be modified to incorporate any number of variations, alterations, substitutions or equivalent arrangements not heretofore described, but which are commensurate with the spirit and scope herein. Additionally, while various embodiments have been described, it is to be understood that aspects herein may be included by only some of the described embodiments. Accordingly, the claims below are not to be seen as limited by the foregoing description. A reference to an element in the singular is not intended to mean "one and only one" unless specifically stated, but rather "one or more." All structural and functional equivalents to the elements of the various embodiments described throughout this disclosure that are known or later, come to be known, to those of ordinary skill in the art are expressly incorporated herein by reference and intended to be encompassed by this disclosure. It is therefore to be understood that changes may be made in the particular embodiments disclosed which are within the scope of the foregoing as outlined by the appended claims.

What is claimed is:

1. An apparatus comprising:
    a first layer having channel regions;
    source/drain structures in the first layer on opposite sides of the channel regions;
    gate stacks on the channel regions, wherein the gate stacks have lower sidewalls adjacent to the source/drain structures and upper sidewalls distal to the source/drain structures;
    source/drain contacts on the source/drain structures;
    lower spacers on the lower sidewalls of the gate stack between the lower sidewalls of the gate stack and the source/drain contacts; and
    upper spacers on the upper sidewalls of the gate stack between the upper sidewalls of the gate stack and the source/drain contacts, wherein the lower spacers have a different etch characteristic from the upper spacers and wherein the upper spacers partially overlap the lower spacers.

2. The apparatus according to claim 1, wherein the upper spacers extend into the source/drain contacts where the upper spacers meet the lower spacers.

3. The apparatus according to claim 1, wherein the upper spacers comprise a material that is damaged less by etching processes relative to the lower spacers.

4. The apparatus according to claim 1, wherein the upper spacers comprise a metal oxide or nitride material, and wherein the lower spacers comprise a low-k insulator material.

5. The apparatus according to claim 1, wherein the upper spacers comprise one of an aluminum oxide, a hafnium oxide, and a silicon nitride, and wherein the lower spacers comprise a silicon oxide.

6. The apparatus according to claim 1, wherein the lower sidewalls and the upper sidewalls are approximately the same length.

7. The apparatus according to claim 1, wherein the first layer comprises a fin of material comprising a semiconductor.

8. An apparatus comprising:
    a first layer having channel regions;
    source/drain structures in the first layer on opposite sides of the channel regions;
    a gate insulator on the channel regions;
    gate stacks on the gate insulator, wherein the gate stacks comprise a gate conductor on the gate insulator and a stack insulator on the gate conductor, and wherein the gate stacks have lower sidewalls adjacent to the source/drain structures and upper sidewalls distal to the source/drain structures;
    source/drain contacts on the source/drain structures;
    lower spacers between the lower sidewalls of the gate stack and the source/drain contacts; and upper spacers between the upper sidewalls of the gate stack and the source/drain contacts, wherein the lower spacers have a different etch characteristic from the upper spacers, wherein the upper spacers comprise a material that is damaged less by etching processes relative to the lower spacers, and wherein the upper spacers partially overlap the lower spacers.

9. The apparatus according to claim 8, wherein the upper spacers extend into the source/drain contacts where the upper spacers meet the lower spacers.

10. The apparatus according to claim 8, wherein the upper spacers comprise a metal oxide or nitride material, and wherein the lower spacers comprise a low-k insulator material.

11. The apparatus according to claim 8, wherein the upper spacers comprise one of an aluminum oxide, a hafnium oxide, and a silicon nitride, and wherein the lower spacers comprise a silicon oxide.

12. The apparatus according to claim 8, wherein the lower sidewalls and the upper sidewalls are approximately the same length.

13. The apparatus according to claim 8, wherein the first layer comprises a fin of material comprising a semiconductor.

14. A method comprising:
    forming source/drain structures on opposite sides of channel regions in a first layer;
    forming gate insulators on the channel regions;
    forming gate conductors on the gate insulators and forming a stack insulator on the gate conductors to form gate stacks;
    forming first spacers on sidewalls of the gate stacks in recesses between the gate stacks, wherein the gate stacks have lower sidewalls adjacent to the source/drain structures and upper sidewalls distal to the source/drain structures;
    forming a sacrificial material on the first spacers to fill the recesses with the sacrificial material;
    reducing a height of the first spacers and the sacrificial material in the recesses to leave the first spacers on the lower sidewalls and to leave the upper sidewalls exposed;
    forming upper spacers on the upper sidewalls, wherein the first spacers have a different etch characteristic from the upper spacers;
    removing the sacrificial material to expose the source/drain structures;
    forming source/drain contacts on the first spacers, the upper spacers, and the source/drain structures to fill the recesses with the source/drain contacts;
    forming a dielectric layer on the source/drain contacts;
    patterning the dielectric layer to form openings to the source/drain contacts; and
    forming conductors in the openings.

15. The method according to claim 14, further comprising additionally reducing the height of the sacrificial material relative to the first spacers before forming the upper spacers to cause the upper spacers to overlap a portion of the first spacers where the first spacers meet the upper spacers.

16. The method according to claim 15, wherein the additionally reducing the height of the sacrificial material forms the upper spacers to extend into the source/drain contacts where the upper spacers meet the first spacers.

17. The method according to claim 14, wherein patterning the dielectric layer includes an etching process that damages the first spacers more than the upper spacers.

18. The method according to claim 14, further comprising removing the first spacers from the source/drain structures at the bottom of the recesses before filling the recesses with the sacrificial material.

19. The method according to claim 14, further comprising patterning a semiconductor material into fins to form the first layer.

* * * * *